United States Patent
Hays et al.

(10) Patent No.: US 6,277,666 B1
(45) Date of Patent: *Aug. 21, 2001

(54) PRECISELY DEFINED MICROELECTROMECHANICAL STRUCTURES AND ASSOCIATED FABRICATION METHODS

(75) Inventors: Kenneth Maxwell Hays, Santa Ana; Eugene Coleman Whitcomb, Mission Viejo, both of CA (US)

(73) Assignee: Honeywell Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/338,962

(22) Filed: Jun. 24, 1999

(51) Int. Cl.[7] .......................... H01L 21/00; H01L 21/84; H01L 21/30; H01L 21/46
(52) U.S. Cl. .............................. 438/50; 438/52; 438/164; 438/456; 438/459
(58) Field of Search ................................. 438/50, 51, 52, 438/53, 164, 456, 458, 459, 464

(56) References Cited

U.S. PATENT DOCUMENTS

| | | |
|---|---|---|
| 5,013,681 | 5/1991 | Godbey et al. . |
| 5,310,451 | 5/1994 | Tejwani et al. . |
| 5,436,173 | 7/1995 | Houston . |
| 5,516,625 | 5/1996 | McNamara et al. . |
| 5,650,568 | 7/1997 | Greiff et al. . |
| 5,663,078 | 9/1997 | McCarthy . |
| 5,705,421 | 1/1998 | Matsushita et al. . |

FOREIGN PATENT DOCUMENTS

| | | |
|---|---|---|
| 0 923 099 | 6/1999 | (EP) . |
| WO 97 29538 | 8/1997 | (WO) . |

OTHER PUBLICATIONS

Brosnihan, Bustillo, Pisano and Howe, Embedded Interconnect and Electrical Isolation for High–Aspect–Ratio, SOI Inertial Instruments, *IEEE Proceedings on Solid–State Sensors and Actuators*, Jun. 16, 1997.

Bernstein, Cho, King, Kourepenis, Maciel and Weinberg, A Micromachined Comb–Drive Tuning Fork Rate Gyroscope, *IEEE Proceedings On Micro Electro Mechanical Systems*, pp. 147–148, Feb. 7, 1993.

*Primary Examiner*—John F. Niebling
*Assistant Examiner*—Viktor Simkovic
(74) *Attorney, Agent, or Firm*—Kris T. Fredrick

(57) ABSTRACT

A method is provided for fabricating a MEMS structure from a silicon-on insulator (SOI) wafer that has been bonded to a support substrate, such as a glass substrate, in order to form silicon components that can be both precisely and repeatedly formed. The SOI wafer includes a handle wafer, an insulating layer disposed on the handle wafer and a silicon layer disposed on the insulating layer. At least one trench is etched through the silicon layer by reactive ion etching. By utilizing the reactive ion etching, the trenches can be precisely defined, such as to within a tolerance of 0.1 to 0.2 microns of a predetermined width. After bonding the support substrate to the silicon layer, the handle wafer is removed, such as by reactive ion etching. Thereafter, the insulating layer is selectively removed, again typically by reactive ion etching, to form the resulting MEMS structure that has a very precise and repeatable size and shape, such as to within a fraction of a micron. As such, a MEMS structure is also provided according to the present invention in which a plurality of silicon components that vary in size by no more than 0.2 microns are bonded to a support substrate, such as to form an array having a plurality of MEMS elements that have the same or substantially similar performance characteristics.

12 Claims, 4 Drawing Sheets

PRECISELY DEFINED MICROELECTROMECHANICAL STRUCTURES AND ASSOCIATED FABRICATION METHODS

FIELD OF THE INVENTION

The present invention relates generally to microelectromechanical structures and associated fabrication methods and, more particularly, to microelectromechanical structures having precisely defined dimensions and associated fabrication methods.

BACKGROUND OF THE INVENTION

In recent years with the proliferation of semiconductor fabrication techniques, a number of microelectromechanical (MEMS) structures have been developed in order to reduce the size and weight of a variety of mechanical and/or electromechanical systems. For instance, some gimbal systems have been replaced by gyroscopes that include one or more MEMS devices. An example of these gyroscopes is described in U.S. Pat. No. 5,650,568 to Paul Greiff et al., the contents of which are incorporated herein by reference. The Greiff '568 patent describes a gimballed vibrating wheel gyroscope for detecting rotational rates in inertial space. As described, the Greiff gyroscope includes a number of lightweight, miniaturized MEMS devices and, as such, has been used in place of the traditional larger and heavier gimbals.

An important advantage in the use of MEMS devices for mechanical and electromechanical systems is the reduction of size and weight that can be achieved over the conventional mechanical systems. However, many mechanical and electromechanical systems, such as the gimballed systems, have many moving parts that must be accurately fabricated in order to operate properly with the requisite accuracy and precision. Thus, the ability to replace conventional mechanical and electromechanical parts with MEMS devices fabricated by semiconductor techniques is limited by the precision that can be achieved with the semiconductor fabrication techniques.

Since the size of most MEMS devices is limited, an array of MEMS elements must oftentimes be used in order to cover a broader area. For example, an inertial sensor can include a number of angular sensor elements, each of which is a separate MEMS device. Although it would be preferred that each element of a MEMS array were identical, conventional arrays of MEMS elements have significant interelement variations in size and shape. In order to appropriately process the signals generated by or provided to the MEMS elements, separate conditioning electronics must oftentimes be used for each MEMS element in order to individually process the signals. As will be apparent, the customized electronics that must be utilized in conjunction with each MEMS element significantly increases the cost and complexity of the resulting array.

Although various semiconductor fabrication techniques have been utilized to manufacture MEMS devices, these fabrication procedures are typically unable to provide the precision required by modern applications, such as the inertial sensing application described above. For purposes of further explanation, however, the fabrication techniques described by the Greiff '568 patent will be discussed below. In this regard, FIGS. 1A–1D illustrate a typical method for manufacturing MEMS devices with a conventional MEMS fabrication technique. The process illustrated in these figures is commonly known as a Dissolved Wafer Process (DWP) and is described in more detail in the Greiff '568 patent.

In particular, with reference to FIG. 1A, a silicon substrate 10 and a support substrate 12, typically formed of an insulating material, such as PYREX® glass, are shown. In a typical MEMS device, the silicon substrate is etched to form the mechanical and/or electromechanical members of the device. The mechanical and/or electromechanical members are generally supported above the support substrate such that the mechanical and/or electromechanical members are free to move.

As illustrated in FIG. 1A, support members 14 are initially etched from the inner surface of the silicon substrate. These support members are commonly known as mesas and are formed by etching, such as with potassium hydroxide (KOH), those portions of the inner surface of the silicon substrate that are exposed through an appropriately patterned layer of photoresist 16. Preferably, the etching is continued until mesas 14 of a sufficient height have been formed.

With reference to FIG. 1B, the etched inner surface 18 of the silicon substrate is thereafter doped, such as with boron, to provide a doped region 20 having a high doping concentration, such as 1 or $2 \times 10^{20}$ atom/cm$^2$, and a predetermined depth. The resulting silicon substrate 10 therefore has both a doped region 20 and an undoped sacrificial region 22. Referring to FIG. 1C, trenches are then formed, such as by a reactive ion etching (RIE), that extend through the doped region 20 of the silicon substrate 10. These trenches eventually define the size and shape of the mechanical and/or electromechanical members of the MEMS device.

As shown in FIGS. 1A–1C, the support substrate 12 is also initially etched and metal electrodes 26 and conductive traces (not shown), are formed on the inner surface of the support substrate. These electrodes and conductive traces will subsequently provide electrical connections to the various mechanical and/or electromechanical members of the MEMS device.

Once the support substrate 12 is processed to form the electrodes and conductive traces, the silicon substrate 10 and the support substrate 12 are bonded together. With reference to FIG. 1D, the silicon and support substrates are bonded together at contact surfaces 28 on the mesas 14, such as by an anodic bond. As a final step, the undoped sacrificial region 22 of the silicon substrate is typically etched with a doping sensitive etch, such as ethylenediamine pyrocatechol (EDP). EDP is a wet etchant that selectively etches the undoped silicon. As such, only the doped region that comprises the mechanical and/or electromechanical member of the resulting MEMS device remains following the etching procedure. The mesas that extend outwardly from the silicon substrate therefore support the mechanical and/or electromechanical members above the support substrate such that the members have freedom of movement. Further, the electrodes formed by the support substrate provide an electrical connection to the mechanical and/or electromechanical members through the contact of the mesas with the electrodes.

While EDP selectively etches the undoped silicon relative to the doped silicon to form the mechanical and/or electromechanical members, the mechanical and/or electromechanical members cannot be precisely defined to within the tolerances demanded by certain applications, such as to within a fraction of a micron for inertial sensing applications, due to non-uniform effects such as slight variations in the doping concentration of the silicon. As such, the mechanical and/or electromechanical members cannot be repeatedly fabricated to within the desired tolerances and the corresponding performance of the resulting MEMS devices will therefore be somewhat different. As described above, an array of MEMS devices would therefore typically require separate electronics for each element since the performance of each element would likely be different than the performance of other elements. As known to those skilled in the art, variations in the doping concentration also has other disadvantageous effects, such as curling of the resulting mechanical and/or electromechanical member. As a result the high doping levels required for selective etching with EDP, crystal structure imperfections can be created and the resonant Q and Young's modulus of the resulting mechanical and/or electromechanical member can vary. Finally, EDP is generally considered toxic and therefore raises a number of environmental concerns and requires specialized and costly handling and disposal procedures.

While a variety of MEMS devices have been developed for reducing the size and weight of the resulting mechanical and/or electromechanical system, conventional MEMS devices and their respective fabrication procedures have not been entirely satisfactory for all applications. In particular, it remains a difficult challenge to fabricate a plurality of MEMS devices having a precisely repeatable size and shape in order to ensure consistent operation, specifically in the context of an array of MEMS devices. In addition, the dissolved wafer processing technique typically utilized to fabricate MEMS structures requires the use of EDP which further increases the complexity of the fabrication process as a result of the specialized handling and disposal procedures that must be followed in order to properly use EDP.

SUMMARY OF THE INVENTION

A method is therefore provided for fabricating a MEMS structure from a silicon-on insulator (SOI) wafer that has been bonded to a support substrate, such as a glass substrate, in order to form silicon components that can be both precisely and repeatedly formed. As such, a MEMS structure is also provided in which a plurality of silicon components with length and width tolerance variations of no more than 0.2 microns are bonded to a support substrate, such as to form an array having a plurality of MEMS elements that have the same or substantially similar performance characteristics.

According to the method of the present invention, an SOI wafer is provided. The SOI wafer includes a handle wafer, an insulating layer disposed on the handle wafer and a silicon layer disposed on the insulating layer. At least one trench is etched through the silicon layer by reactive ion etching. Preferably, the reactive ion etch extends completely through the silicon layer, but terminates upon reaching the insulating layer. By utilizing the reactive ion etching, the trenches can be precisely defined, such as to within a tolerance of 0.1 to 0.2 microns of a predetermined width and length.

Thereafter, a support substrate, typically comprised of a glass plate, is bonded to the silicon layer. In one advantageous embodiment, the surface of the support substrate that is bonded to the silicon layer is nonplanar such that at least one cavity is defined between the support substrate and the SOI wafer. For example, the support substrate can include a plurality of mesas separated by recessed portions that are defined by the nonplanar surface to which the SOI wafer is bonded. In one embodiment, the surface of the support substrate that is bonded to the silicon layer also supports at least one conductive element, such as an electrode or a conductive trace, for electrically communicating with the silicon component.

After bonding the support substrate to the silicon layer, the handle wafer is removed, such as by reactive ion etching. Thereafter, the insulating layer is selectively removed, again typically by reactive ion etching. Upon selectively removing the insulating layer, the resulting MEMS structure is formed. As a result of the reactive ion etch of the trenches through the silicon layer of the SOI wafer, the silicon component of the resulting MEMS structure will have a very precise and repeatable size and shape, such as to within a small fraction of a micron.

In embodiments of the present invention in which the surface of the support substrate that is bonded to the silicon layer is nonplanar, the silicon component will be suspended, at least partially, over the cavity defined between the support substrate and the silicon layer. For example, in embodiments in which the surface of the support substrate that is bonded to the silicon layer includes a plurality of mesas, the silicon component of the resulting MEMS structure will preferably be suspended from a respective mesa over an adjacent recessed portion.

In addition, in embodiments in which the surface of the support substrate that is bonded to the silicon layer supports at least one conductive element, the silicon component of the resulting MEMS structure will at least partially overlie the at least one conductive element. As such, signals can be provided to and received from the silicon component of the resulting MEMS structure.

Since the size and shape of the resulting MEMS structures are both precise and repeatable, an array having a plurality of MEMS elements is also provided according to the present invention. The array includes a support substrate, such as a glass plate, having a nonplanar surface that includes mesas and recessed portions. The MEMS structure of this embodiment also includes a plurality of silicon components bonded to the mesas of the nonplanar surface of the support substrate such that the silicon components are suspended over recessed portions of the nonplanar surface of the support substrate, thereby forming the plurality of MEMS elements. Since the fabrication method of the present invention no longer must utilize EDP, the intentional doping concentration of the silicon can be significantly reduced to less than $1 \times 10^{20}$ atoms/cm$^3$ and, in some embodiments, to 0. By reducing the doping concentration relative to conventional MEMS structures, the crystal structure imperfections are decreased and the tendency of the silicon components to curl is reduced.

Additionally, the silicon components of the MEMS array of the present invention differ in size by no more than 0.2 microns in order to facilitate consistent performance between the MEMS elements. By forming a plurality of MEMS elements that perform the same or quite similarly, the resulting measurements obtained by the array should be more precise and should require less signal processing in order to compensate for performance differences between the MEMS elements. As such, the sophisticated and costly conditioning electronics are therefore substantially reduced relative to conventional arrays of MEMS elements.

As described above, the MEMS structure of the present invention can also include a plurality of conductive elements supported by the nonplanar surface of the support substrate such that the silicon components at least partially overlie respective conductive elements. As such, signals can be transmitted to and received from the individual silicon components.

The fabrication method of the present invention therefore permits MEMS structures to be precisely formed in a repeatable manner. As such, the performance characteristics of the resulting MEMS structure are more predictable. In addition, the MEMS structures can be incorporated into an array in which each of the elements performs in the same or a substantially similar manner to other elements, thereby improving the overall performance of the array and reducing the complexity of the conditioning electronics required to interface with each of the MEMS elements. As a result of the fabrication method of the present invention, the silicon no longer need be heavily doped and, as such, the problems, such as curling and crystal structure imperfections that occur with heavy doping concentrations, can be avoided. In addition, the fabrication method of the present invention preferably utilizes reactive ion etching, not EDP, thereby simplifying the fabrication process by eliminating the complex handling and disposal procedures required for EDP.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The method of the present invention fabricates unique MEMS structures having precisely defined mechanical and/or electromechanical members, while permitting the mechanical and/or electromechanical members to be lightly doped, if at all. As such, arrays having a plurality of MEMS elements can be fabricated that have only minor and negligible variations in the size and shape of the individual MEMS elements, thereby permitting the array to operate in an extremely reliable manner without requiring customized conditioning electronics for each of the MEMS elements.

Figure 1A:
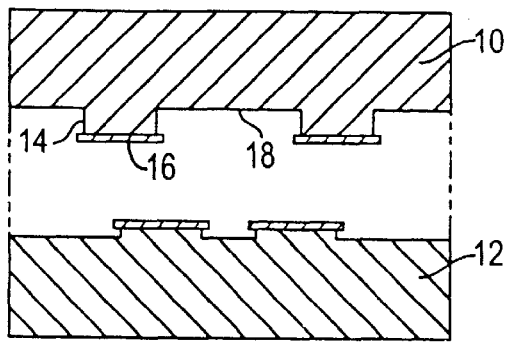
FIGS. 1A–1D are sequential cross-sectional views of a conventional dissolved wafer process for forming a MEMS device.
Figure 1B:
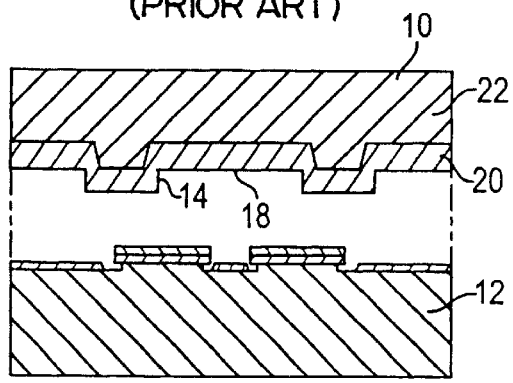
Figure 1C:
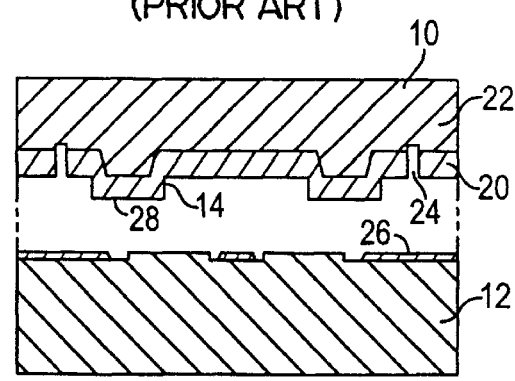
Figure 1D:
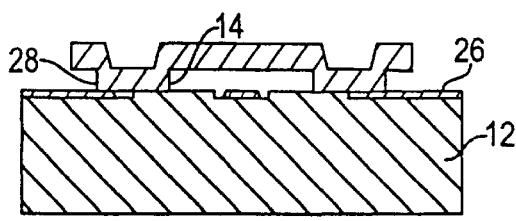
Figure 2A:
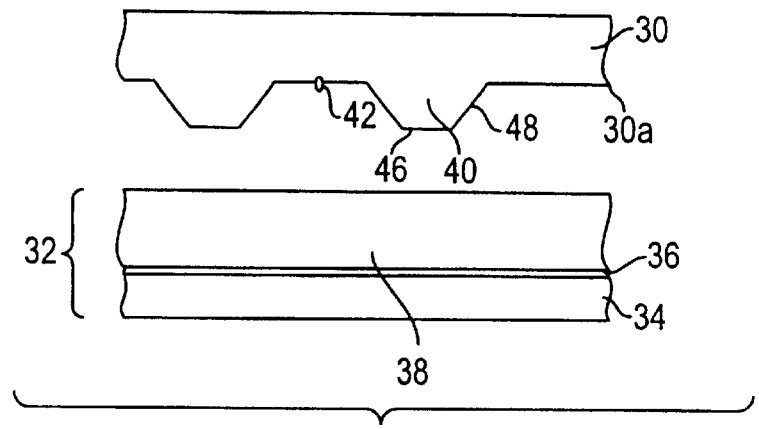
FIGS. 2A–2D are sequential cross-sectional views illustrating the operations performed to form a MEMS device according to one advantageous embodiment of the present invention.

FIGS. 2A–2D illustrate an advantageous embodiment of the operations performed to fabricate MEMS structures according to the present invention. As shown in FIG. 2A and in block 60 of FIG. 3, a support substrate 30 and a silicon-on insulator (SOI) wafer 32 are provided. As shown, the SOI wafer includes a handle wafer 34, an insulating layer 36 disposed on the handle wafer and a silicon layer 38 disposed on the insulating layer. Although the handle wafer and the insulating layer can be formed of a variety of materials, the SOI wafer of one advantageous embodiment includes a handle wafer formed of silicon and an insulating layer formed of silicon dioxide. For reasons described hereinbelow, the exposed surface of the silicon layer is preferably planar. In addition, the thickness of the silicon layer can vary depending upon the particular application. However, the thickness of the silicon layer is preferably in the 1–30 micron range. The insulating layer can have a variety of thicknesses, but is typically quite thin relative to the silicon layer. In one embodiment, for example, the insulating layer has a thickness of about 0.3 microns.

The support substrate 10 is formed of a dielectric material, such as a glass plate. In one advantageous embodiment, for example, the support substrate is formed of a PYREX® glass. However, the support substrate can be formed of other materials, including semiconductor materials, if so desired. As shown in FIG. 2A, the surface 30a of the support substrate that faces the SOI wafer is preferably nonplanar. More particularly, the surface of the support substrate that faces the SOI wafer preferably includes mesas 40 separated by recessed portions 42. Although the mesas can be formed in a variety of manners, the mesas are typically formed by placing a photosensitive layer or film, typically referred to as photoresist, on the surface of the support substrate that faces the SOI wafer. The photoresist is then at least partially covered by a mask and the exposed portions of the photoresist are eliminated. Although the photoresist is typically illuminated with a UV light source, the photoresist can be illuminated with any light source capable of properly exposing the photoresist. After portions of the photoresist have been exposed to light, portions of the photoresist are removed by exposing the photoresist to a developer solution, such as SHIPLEY® developer concentrate. As known to those skilled in the art, either the portions of the photoresist that were exposed to the light or the portions of the photoresist that were not exposed to light will be removed depending upon whether a positive or negative photoresist is utilized, respectively. The portions of the support substrate that are exposed, i.e., that are not covered by the remaining photoresist, are then etched, such as by reactive ion etching. The etching process continues until the portions of the support substrate surrounding the mesas have been removed such that the mesas have the desired height. Thereafter, the remaining portions of the photoresist are removed.

Figure 2B:
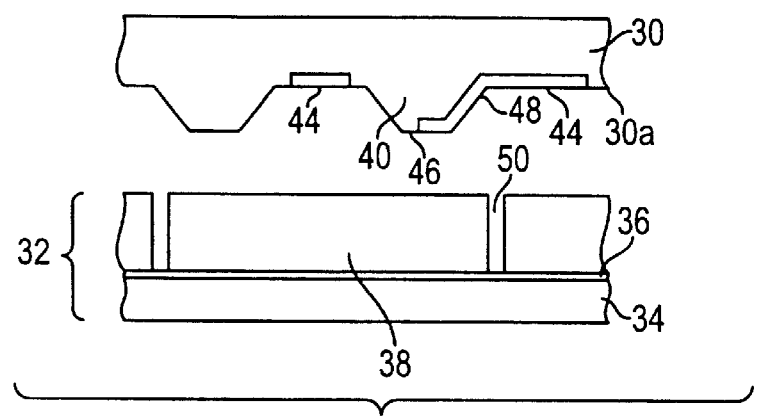
Figure 3:
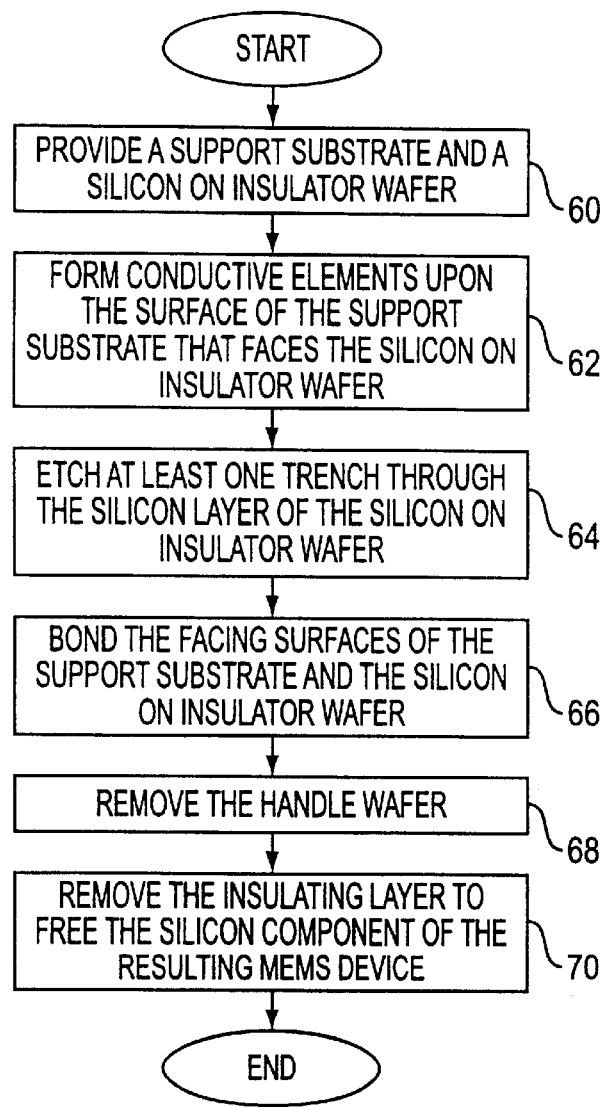
FIG. 3 is a flow chart of the operations performed to fabricate a MEMS device according to one embodiment of the present invention.

With reference to FIG. 2B and block 62 of FIG. 3, after the mesas 40 have been formed, the method of the present invention can further include the step of depositing a conductive material, such as a metal, on the surface 30a of the support substrate 30 that faces the SO wafer 32 in order to form conductive elements 44, such as electrodes and conductive traces. To prevent the conductive material from extending above the surface of the support substrate, however, the surface of the support substrate is first selectively etched to define recessed regions in which the conductive material may be deposited. Although not illustrated, the formation of the conductive element typically includes the placement of photoresist on the surface of the support substrate and the patterning of the photoresist such that the photoresist only covers those regions of the surface of the support substrate upon which conductive material is not to be deposited, i.e., those portions designed to be free of conductive material. In other words, those portions of the surfaces of the support substrate that are to be etched and thereafter coated with a conductive material are not covered by the patterned photoresist and are therefore exposed. The method of the present invention further includes the etching of the exposed portions of the surface of the support substrate, such as by means of BOE to form recessed regions having the predefined pattern. Thereafter, conductive material can be deposited in the etched recesses to form electrodes and conductive traces. As known in the art, the electrodes and conductive traces may be comprised of a variety of conductive materials, such as a multi-layered deposition of titanium, platinum and gold, and may be deposited by any suitable technique, such as sputtering. Thereafter, the remaining portions of the photoresist are removed.

As shown in FIGS. 2A and 2B, it is oftentimes advantageous to provide mesas 40 that have a contact surface 46 that extends between a set of sloped sidewalls 48. These sloped sidewalls allow the metal to be deposited on both the contact surface and at least one sidewall of the mesa by "stepping" metal up the sidewall to the contact surface.

It is important to note that the mesas 40 may assume any geometric form. For instance, in this embodiment, the mesas are formed in a frusto pyramidal shape, however, the cross-sectional shape of the mesas may also assume other forms such as octagonal, cylindrical, etc., as needed for the particular application. Further, it is understood that although the sloped sidewalls 48 are referred to as a set of sloped sidewalls, only one of the sidewalls of the set may be sloped in some applications.

With reference now to FIG. 2B and block 64 of FIG. 3, the silicon layer 38 of the SOI wafer 32 is also etched to separate or otherwise define the mechanical and/or electromechanical members of the resulting MEMS structure. In this regard, at least one trench 50 is etched through the silicon layer by reactive ion etching. Since the mesas 40 are formed on the surface 30a of the support substrate 30, the surface of the silicon layer can remain planar. As such, the precision with which the trenches can be etched by reactive ion etching is even further improved relative to the reactive ion etching of nonplanar surfaces. As such, the trenches can be etched to within an extremely small tolerance, such as to within 0.1 to 0.2 microns of a desired width.

Although not illustrated, the trenches 50 can be etched by initially coating the silicon layer 38 with a photoresist. After covering the photoresist with a mask that defines the region to eventually be etched, the exposed portions of the photoresist are eliminated. After removing the mask, portions of the photoresist are removed such that the entire surface of the silicon layer is covered with the photoresist with the exception of those regions that will be etched. The exposed portions of the silicon layer are then etched by reactive ion etching to form trenches through the silicon layer. Preferably, the etching is terminated once the insulating layer is reached. After the trenches have been etched, the remaining photoresist is removed.

Figure 2C:
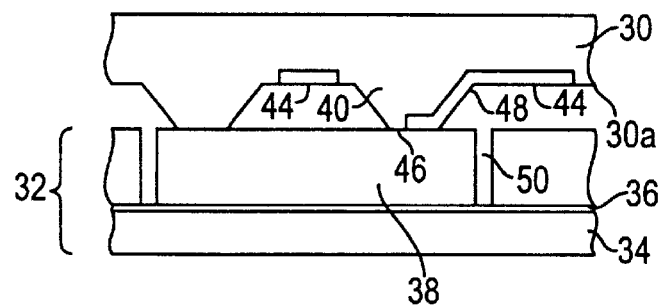

With reference to FIG. 2C and block 66 of FIG. 3, the facing surfaces of the support substrate 30 and the silicon layer 38 of the SOI wafer 32 are then brought into contact. In this regard, the silicon layer generally makes contact with the mesas 40 defined by the surface 30a of the support substrate. The SOI wafer and the support substrate are then bonded. In a preferred embodiment, the support substrate and the SOI wafer are anodically bonded. However, it should be understood that the support substrate and the SOI wafer can be bonded in other manners so long as the bond provides for secure engagement of the SOI wafer and the support substrate.

After bonding the support substrate to the silicon layer of the SOI wafer, the handle wafer 34 and the insulating layer 36 are removed. See blocks 68 and 70 of FIG. 3. For example, a handle wafer formed of silicon is typically removed by etching the handle wafer and, more particularly, by reactive ion etching the handle wafer. Likewise, the insulating layer is typically removed by etching the insulating layer and, more particularly, by reactive ion etching the insulating layer. Once the insulating layer has been removed, the portion of the silicon layer 38 defined by the trenches 50 that were etched through the silicon layer is completely separated from the other portions of the silicon layer. See FIG. 2D. Typically, the portions of the silicon layer defined by the trenches etched therethrough define components of the resulting MEMS structure, such as components of a gyroscope as described below.

Although not necessary for the practice of the present invention, the nonparallel surface 30a of the support substrate 30 and, more typically, the mesas 40 of the support substrate effectively suspend the silicon component over the cavity defined between the silicon layer 38 and the support substrate. As a result of this suspended relationship with respect to the support substrate and the prior removal of the handle wafer 34 and the insulating layer 36, the silicon component is preferably moveable relative to the support substrate. In addition, the silicon component can overlie one or more of the conductive elements 44 supported by the support substrate. As shown, the silicon component can make contact with some of the conductive elements and can be spaced from others of the conductive elements, as desired for the particular application of the resulting MEMS structure. As such, signals can be provided to the silicon component, such as to heat or drive the silicon component, and signals can be received from the silicon component, such as to measure deflection or other movement of the silicon component in a sensor application or the like.

By fabricating the MEMS structure as described above, the resulting MEMS structure can be both precisely and repeatedly formed. In this regard, the dimensions of each MEMS structure can be defined to within the tolerances imposed by the reactive ion etching of the trenches 50 through the silicon layer 38 of the SOI wafer 32. For example, the reactive ion etching of the trenches through the silicon layer typically has a tolerance of 0.1 to 0.2 microns of a predetermined width and length. As a result of the precision and repeatability of the fabrication process, an array having a plurality of MEMS elements can be fabricated in which the size and shape and therefore the performance characteristics of each of the MEMS elements is the same or substantially similar. As such, the plurality of MEMS elements can sometimes utilize the same signal conditioning electronics, thereby reducing the complexity and costs of the resulting array. If not identical, the signal conditioning electronics associated with each MEMS element need be only slightly modified in order to compensate for minor differences in the performance characteristics of the MEMS elements. In either instance, the complexity and cost of the signal conditioning electronics and, in turn, the array are significantly reduced relative to arrays that require substantially different signal conditioning electronics for each MEMS element. By facilitating the formation of an array having a plurality of MEMS elements, the size of each MEMS element can remain small, thereby reducing the chance of curling of the silicon components.

Figure 2D:
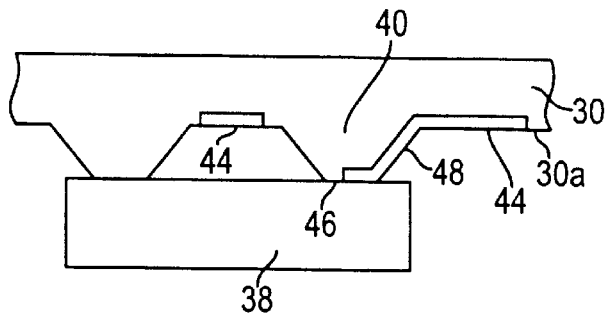

In addition to the associated fabrication method, a MEMS structure is also provided according to another embodiment of the present invention that includes an array of identical or nearly identical MEMS elements. In particular, the MEMS structure of this embodiment includes a support substrate 30 having a nonplanar surface 30a that defines mesas 40 and recessed portions 42. The MEMS structure also includes a plurality of silicon components bonded to the mesas of the nonplanar surface of the support substrate. As such, the silicon components are suspended over recessed portions of the nonplanar surface of the support substrate to thereby form a plurality of elements, one of which is shown by FIG. 2D. As a result of the unique fabrication process of the present invention, a silicon component need not be highly doped as required of conventional silicon components fabricated according to a dissolved wafer process. Instead, the silicon components may have a doping concentration of substantially less than $1\times10^{20}$ atoms/cm$^3$. In this regard, the silicon components can either be undoped or the silicon components can be lightly doped such that the doping concentration is between 0 and $1\times10^{20}$ atoms/cm$^3$. As a result of the fabrication process of the present invention, the respective dimensions of the plurality of silicon components also differ in size by no more than one micron per dimension, i.e., no more than 0.5 microns in width or length. More typically, the respective dimensions of the silicon components differ in size by no more than 0.2 microns to thereby facilitate consistent performance between the elements, as described above.

As discussed previously, MEMS devices are used in a wide variety of applications. As such, the MEMS structure of the present invention is suitable for a variety of applications including inertial sensor arrays including yaw rate sensors and accelerometers for automotive, aerospace and other military applications. In addition, the MEMS structure of the present invention can be employed in a wide variety of non-inertial applications, including switching applications, such as the RF switches for a phased array antenna, which utilize arrays of switches which may or may not operate cooperably. For purposes of further explanation, however, one particularly advantageous application will be hereinafter described in which the MEMS structure of the present invention for the elements of an inertial sensor array.

Figure 4:
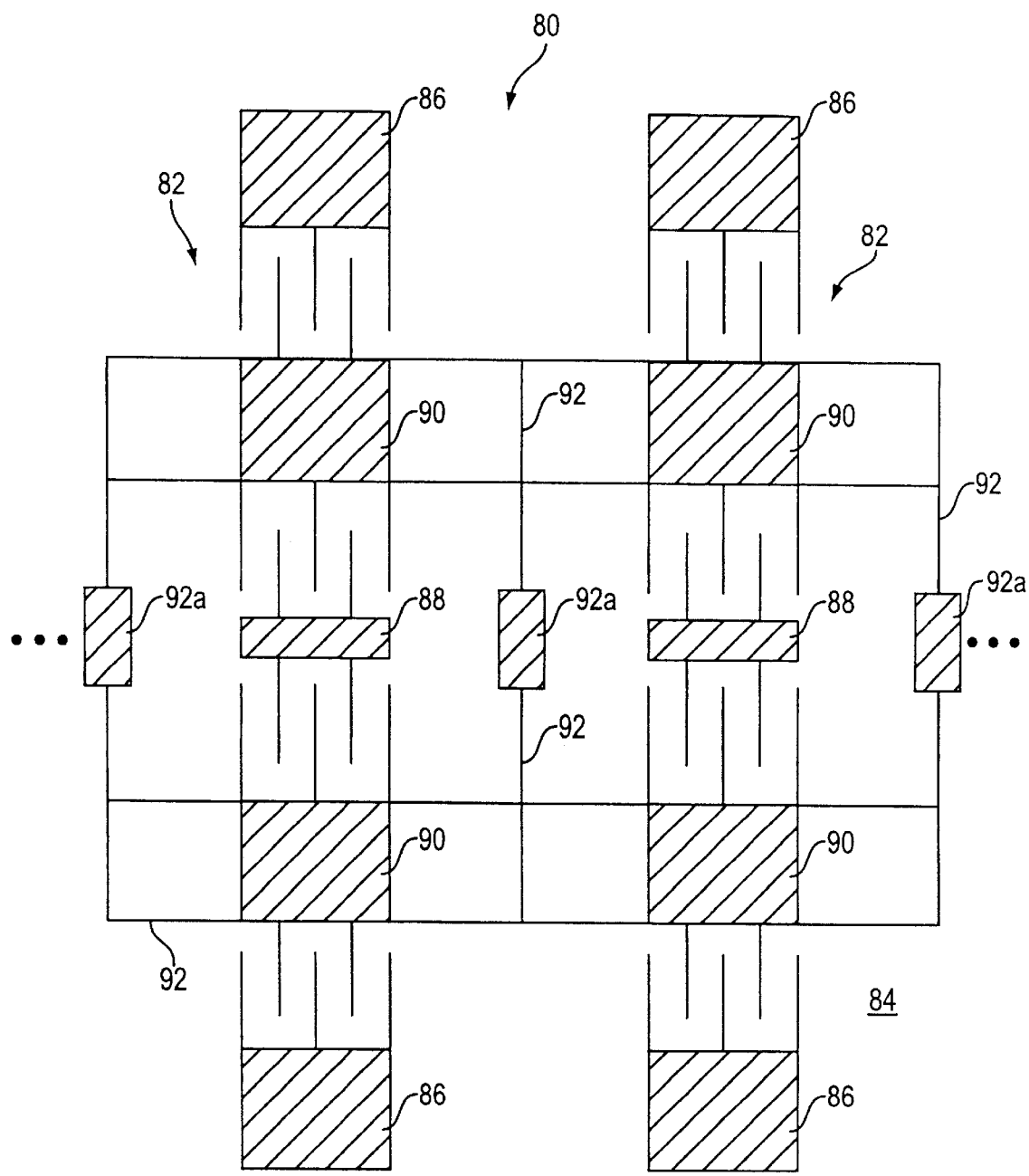
FIG. 4 is a plan view of a portion of an array of MEMS elements that illustrates two elements of an inertial sensor array according to one embodiment of the present invention.

An inertial sensor array 80 includes a plurality of MEMS elements 82, two of which are depicted in FIG. 4. In particular, the inertial sensor array includes a support substrate 84, typically formed of PYREX ® glass, that preferably includes mesas and recessed portions as described above. The inertial sensor array also includes a plurality of silicon components bonded to the mesas of the support substrate such that the silicon components are suspended over the support substrate to thereby form the plurality of elements. In this regard, each MEMS element of the illustrated embodiment includes a pair of silicon components that are bonded to corresponding mesas and that form drive combs 86 that are fixed with respect to the substrate. In addition, each MEMS element of the illustrated embodiment includes another silicon component that is bonded to a corresponding mesa and that forms a pick off comb 88 that also is fixed with respect to the substrate. Since FIG. 4 is a plan view, the mesas are not shown, however, the mesas would substantially underlie the regions designated 86 and 88 that illustrate the drive combs and the pick off comb, respectively.

Each MEMS element 82 also includes silicon components that form a pair of proof masses 90 that are suspended above the support substrate 84 by means of silicon flexures 92. The flexures are, in turn, supported above the recessed portions of the support substrate by means of mesas that underlie those portions of the flexures designated 92a in FIG. 4. Once the proof masses are driven to vibrate or dither by the drive combs 86, the relative capacitance between the proof masses and the support substrate can be monitored to determine the yaw rate and acceleration experienced by the respective MEMS element.

According to the present invention, the silicon components need not be highly doped. As such, the silicon components can be lightly doped, i.e., less than $1\times10^{20}$ atoms/cm$^3$, or undoped. As such, the problems, such as curling and crystal structure imperfections, that occur with heavy doping concentrations can be avoided. In addition, the fabrication method of the present invention preferably utilizes reactive ion etching, not EDP, thereby simplifying the fabrication process by eliminating the complex handling and disposal procedures required for EDP.

Further, the MEMS elements 82 of an array 80 according to this embodiment of the present invention can be precisely formed in a repeatable manner. In this regard, the silicon components of each element of an array, such as the dimensions of the silicon components described above, preferably differ in size by no more than 0.5 microns and, more typically, by no more than 0.2 microns relative to the corresponding dimensions of the same type of silicon component of another element of the array. As such, the performance characteristics of each MEMS element are more predictable. In addition, once the MEMS elements are incorporated into an array, each MEMS element will perform in the same or a substantially similar manner to other elements, thereby improving the overall performance of the array and reducing the complexity of the conditioning electronics required to interface with each of the MEMS elements.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for fabricating a microelectromechanical (MEMS) structure comprising:

providing a silicon-on-insulator (SOI) wafer comprising a handle wafer, an insulating layer disposed on the handle wafer and a silicon layer disposed on the insulating layer;

etching at least one trench through the silicon layer by reactive ion etching;

bonding a support substrate to the silicon layer following said etching step, wherein a surface of the support substrate that is bonded to the silicon layer is nonplanar such that at least one cavity is defined between the support substrate and the SOI wafer;

removing the handle wafer following said bonding step; and thereafter selectively removing the insulating layer such that the resulting MEMS structure comprises a silicon component at least partially suspended over the cavity and at least partially defined by the at least one trench etched through the silicon layer.

2. A method according to claim 1 further comprising providing the support substrate having a plurality of mesas separated by recessed portions that are defined by the nonplanar surface to which the SOI wafer is thereafter bonded, and wherein said bonding step comprises bonding the support substrate to the silicon layer such that the silicon component is suspended from a respective mesa over an adjacent recessed portion.

3. A method according to claim 1 further comprising providing the support substrate having at least one conductive element supported by the nonplanar surface to which the SOI wafer is thereafter bonded such that the silicon component at least partially overlies the at least one conductive element.

4. A method according to claim 1 wherein said etching step comprises terminating the reactive ion etching upon reaching the insulating layer.

5. A method according to claim 1 wherein removing the handle wafer comprises etching the handle wafer.

6. A method according to claim 1 wherein selectively removing the insulating layer comprises etching the insulating layer.

7. A method for fabricating a microelectromechanical (MEMS) structure comprising:

providing a silicon-on-insulator (SOI) wafer comprising a handle wafer, an insulating layer disposed on the handle wafer and a silicon layer disposed on the insulating layer;

etching at least one trench through the silicon layer by reactive ion etching;

bonding a support substrate to the silicon layer following said etching step, wherein a surface of the support substrate that is bonded to the silicon layer supports at least one conductive element;

removing the handle wafer following said bonding step; and thereafter selectively removing the insulating layer such that the resulting MEMS structure comprises a silicon component that at least partially overlies the at least one conductive element supported by the support substrate and that is at least partially defined by the at least one trench etched through the silicon layer.

8. A method according to claim 7 further comprising providing the support substrate prior to said bonding step, wherein the surface of the support substrate that is bonded to the silicon layer is nonplanar to thereby define at least one cavity between the support substrate and the SOI wafer over which the silicon component is at least partially suspended.

9. A method according to claim 8 wherein said providing step comprises providing the support substrate having a plurality of mesas separated by recessed portions that are defined by the nonplanar surface to which the SOI wafer is thereafter bonded, and wherein said bonding step comprises bonding the support substrate to the silicon layer such that the silicon component is suspended from a respective mesa over an adjacent recessed portion.

10. A method according to claim 7 wherein said etching step comprises terminating the reactive ion etching upon reaching the insulating layer.

11. A method according to claim 7 wherein removing the handle wafer comprises etching the handle wafer.

12. A method according to claim 7 wherein selectively removing the insulating layer comprises etching the insulating layer.

* * * * *